United States Patent [19]

Galano et al.

[11] Patent Number: 5,161,169

[45] Date of Patent: Nov. 3, 1992

[54] DCD WITH REPROGRAMMING INSTRUCTIONS CONTAINED IN REMOVABLE CARTRIDGE

[75] Inventors: Kenneth P. Galano, Wrentham; Paul H. Cheverie, Marshfield Hills, both of Mass.

[73] Assignee: Codex Corporation, Mansfield, Mass.

[21] Appl. No.: 523,626

[22] Filed: May 15, 1990

[51] Int. Cl.$^5$ ............................................... H04B 1/38
[52] U.S. Cl. ........................................ 375/8; 364/708
[58] Field of Search ................... 375/7, 8; 379/94, 96, 379/98; 364/708, 709

[56] References Cited

U.S. PATENT DOCUMENTS

| | | | |
|---|---|---|---|
| 4,518,823 | 5/1985 | Kessler | 375/8 |
| 4,667,299 | 5/1987 | Dunn | 364/708 |
| 4,669,053 | 5/1987 | Krenz | 364/708 |
| 4,965,641 | 10/1990 | Blackwell et al. | 375/7 |

*Primary Examiner*—Stephen Chin
*Attorney, Agent, or Firm*—Jon P. Christensen

[57] ABSTRACT

A digital communications device with a removeable cartridge is disclosed for programming the functions and primary operations into a digital communications device as for example a modem. Examples of programmable functions include data transmission rates, interface protocols and/or full duplex mode of operation.

13 Claims, 4 Drawing Sheets

DCD WITH REPROGRAMMING INSTRUCTIONS CONTAINED IN REMOVABLE CARTRIDGE

TECHNICAL FIELD

This invention relates generally to the field of communications devices and is especially, but not exclusively, suited to modems.

BACKGROUND

Communication modems are known. Such devices typically transmit digital information by converting the data, using a modulation technique, to a form compatible with the transmission medium.

Efforts to standardize modem operation have met with limited success. Varying transmission mediums as well as varying and changing communications needs have resulted in continuing diversity in modem operation. The diversity has evolved in part because a modem operating under a single set of parameters and operating techniques does not work equally well under all conditions. Different transmission mediums, data loads, and speed require different modem operating characteristics.

Digital interfaces have also changed as improvements are implemented. The result is that modem manufacturers must carry a wide variety of models having varying operational characteristics. One method used to ease the burden of changing technology and for varying operational modes has been through the use of interchangeable memory cards. Interchangeable memory cards can be programmed with varying modem parameters as well as with modifications to modulation techniques and timing characteristics.

Disadvantages of replaceable memory cards include difficulty of replacement, contamination of electrical contacts, and electrical damage due to static electricity or otherwise faulty handling. Replacement of memory cards require the participation of trained technicians because of the need for partial disassembly of the modem and because of the need to handle sensitive electronics circuits.

The need for trained technicians for modem updates is inefficient either because of the down-time incurred in returning a modem back to the manufacturer for modification or because of the time incurred by a technician traveling to the location of a modem.

A need exists for a means to manually reprogram modems by the user at the user's location. Such a means is beneficial not only because of the time savings but also because such a means increases the utility of a given modem. Ease of change allows a modem to be used in multiple applications. Ease of change may also allow for modem standardization and for less re-design on the part of manufacturers as modem standards change. Ease of change also facilitates the use of the most recent modem update and the inherent efficiency improvements involved therein.

SUMMARY OF THE INVENTION

Pursuant to one embodiment of the invention, digital communication devices (DCDs), including but not limited to modems, are constructed to receive removable data cartridges (cartridges). A DCD is used to interface geographically diverse digital systems over a transmission medium. The cartridge contains at least some of the software used by the DCD and defines the primary functions and operation of the DCD. Included within the cartridge may be such parameters as operating speed, protocols, modulation method, and modes of transmission.

In one embodiment, the DCD is also constructed to contain the hardware necessary to perform a variety of functions under different operating scenarios. Examples of this built-in flexibility may be the hardware necessary to support a full duplex mode of transmission or to support synchronous or asynchronous transmission. In one embodiment of the invention the DCD may be standardized to support the most sophisticated communication transaction then used with actual operating conditions defined by the cartridge.

The cartridge contains certain operating software of the DCD in memory modules such as read-only-memory (ROMs) located on a memory card within the cartridge. The memory card may also have auxiliary data processing devices such as co-processors for support of operating requirements. An electrical connector is provided on the memory card to interface the cartridge with the DCD.

The cartridge disclosed in this invention is constructed to protect the devices located on the memory board from mechanical or electrical damage when removed from the DCD thereby safeguarding the instructions and other software contained therein. The cartridge is also constructed to be installed by a user into a receptacle within the DCD without tools or risk of injury. Protection of the memory board is provided by a door with a locking means that encloses and prevents access to the electrical connector thereby protecting the memory board and devices from damage.

BRIEF DESCRIPTION OF PERSPECTIVE DRAWINGS

FIG. 1 comprises a depiction of a cartridge and a DCD.

FIG. 2 comprises a perspective exploded view of the cartridge.

FIG. 3 comprises a depiction of the cartridge and a cartridge carrier within the DCD.

DETAILED DESCRIPTION

Figure 1:
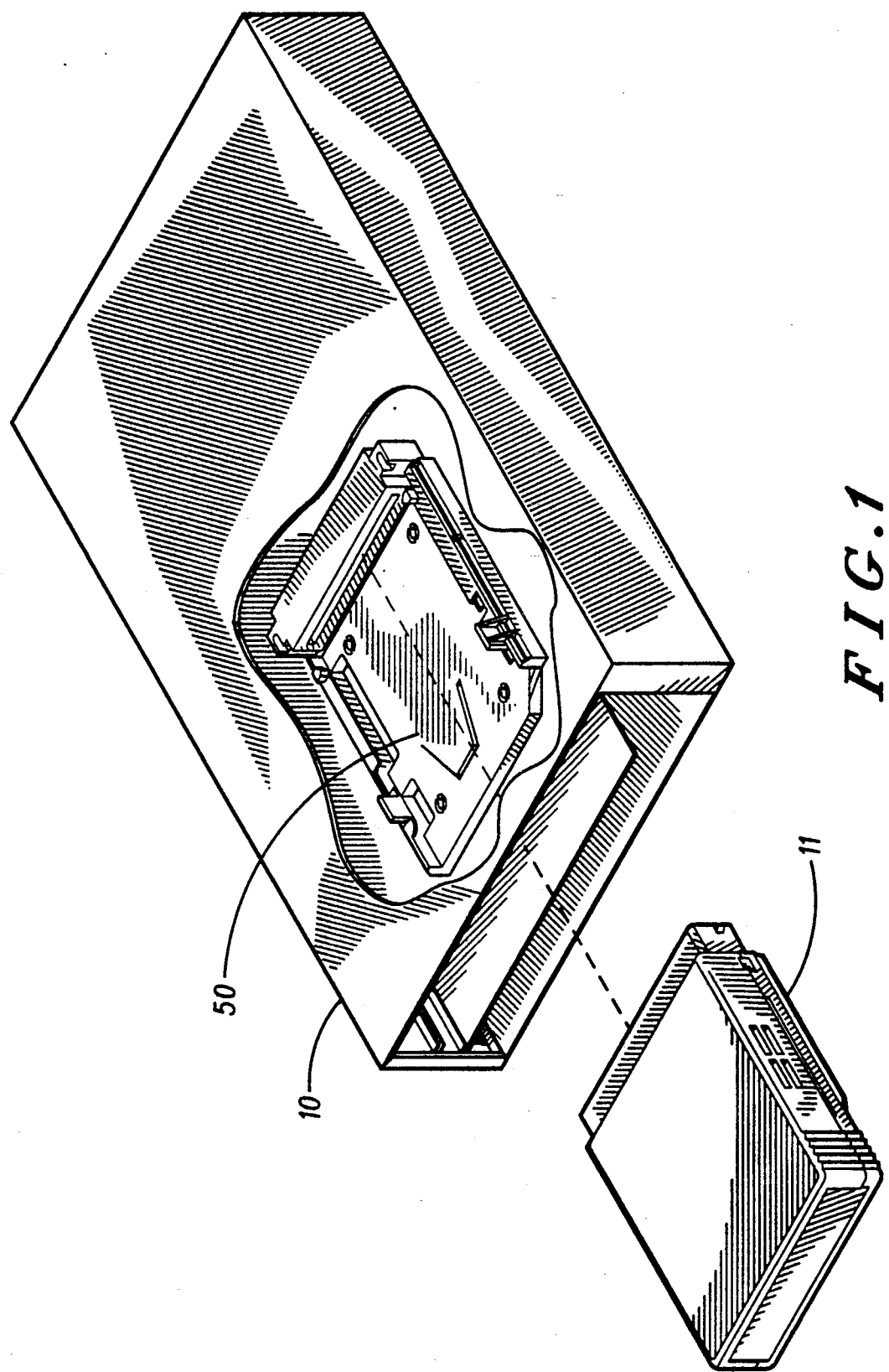

FIG. 1 depicts a cartridge (11) in accord with the present invention and the mode of insertion of the cartridge (11) into a DCD (10). In this exemplary embodiment the cartridge is inserted into a receiving port (50) on the front of the DCD. It should be apparent that in other embodiments the cartridge may be inserted from the front, the side, or the back.

Figure 2:
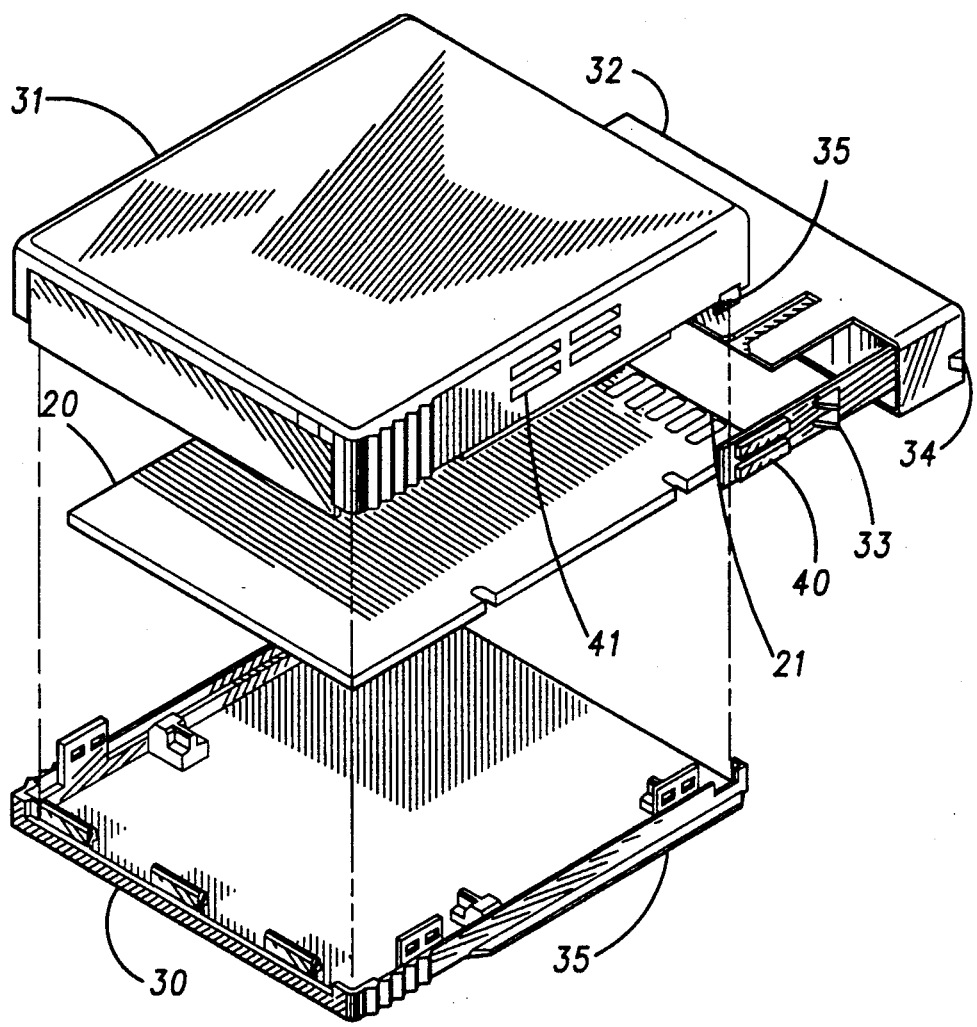

The cartridge assembly (FIG. 2) is constructed with a memory card PCB (20) mounted in a stationary position to a housing comprising a base (30), a cover (31), and a door (32) on the DCD interface side of the cartridge. The purpose of the housing is to protect the memory card from mechanical or electrial damage during shipping or handling and to allow installation of the cartridge by a user without the need for tools or a technician.

The memory card (20) contains memory devices (not shown), such as ROMs storing instructions for use within the DCD, and electrical access connectors (21) adjacent the end of the memory card for establishing connections with the memory devices, fixedly mounted relative to the housing, and extending beyond the housing (11). In this embodiment, the electrical connection (21) provides a means for establishing electrical contact with the DCD in the form of PC card gold finger contacts.

The door (32) is retained in a sheathed (first) position by a locking projection (40 in FIG. 2) disposed on a lever releasibly engaging a catch aperture (41 in FIG. 2) on each side of the cartridge cover (31). When held in the first position the distal end of the door (32) extends beyond the housing (11) and beyond the electrical connector (21) on the memory card thereby protecting the memory card electrical connection (21) and preventing access to the electrical connectors when the cartridge (11) is not inserted into the receiving port (50). Upon release of the locking projection (40 in FIG. 2) the door may be moved to a second position wherein the electrical connector (21) extends beyond the distal end of the door (32) for engagement with the DCD.

Figure 3:
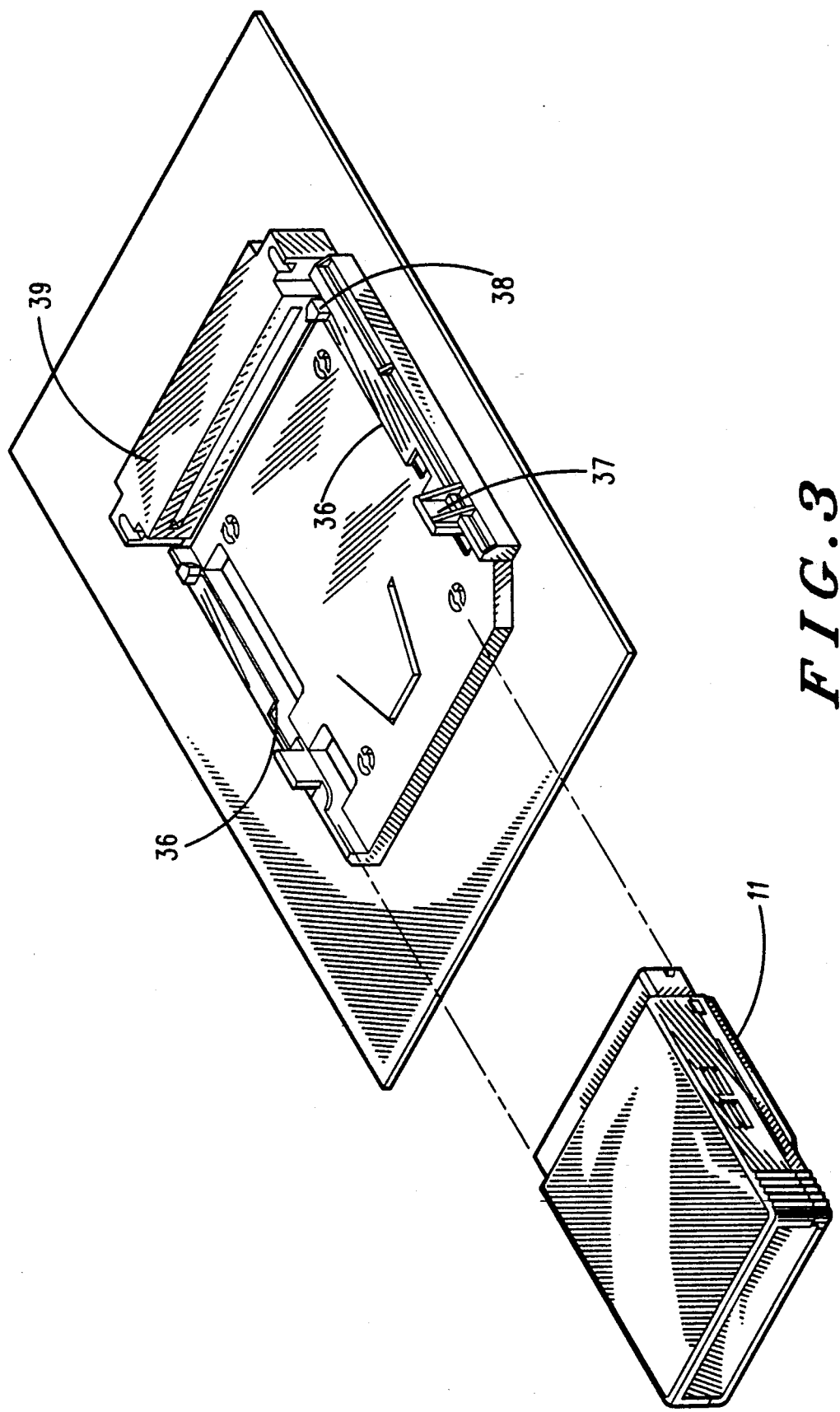

In use the cartridge (11 in FIG. 1) is inserted into a receiving port (50) within the DCD (10 in FIG. 1). Upon insertion the cartridge (11) enters a cartridge carrier (shown diagrammatically in FIG. 3) within the DCD (10 in FIG. 1) containing an engagement plate (37) for contacting and releasing the locking projection (40). In one embodiment of the invention, once inserted, the cartridge is restrained from vertical or lateral movement through a track (35 in FIG. 2) and guide assembly (36 in FIG. 3).

Figure 4:
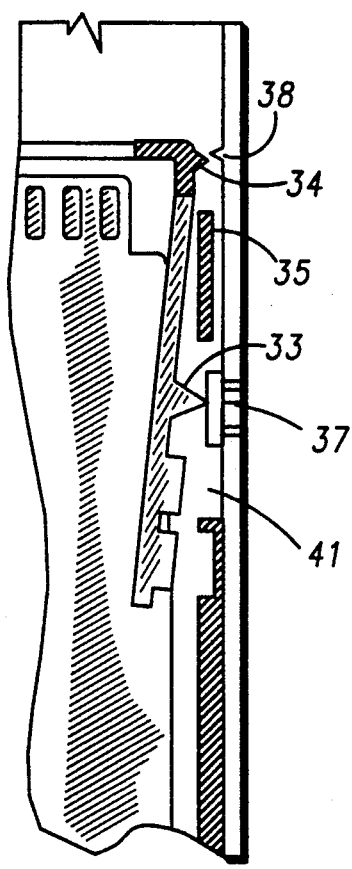
FIG. 4 depicts a cross-sectional top plan view of one side of the cartridge partially inserted into the DCD.
Figure 5:
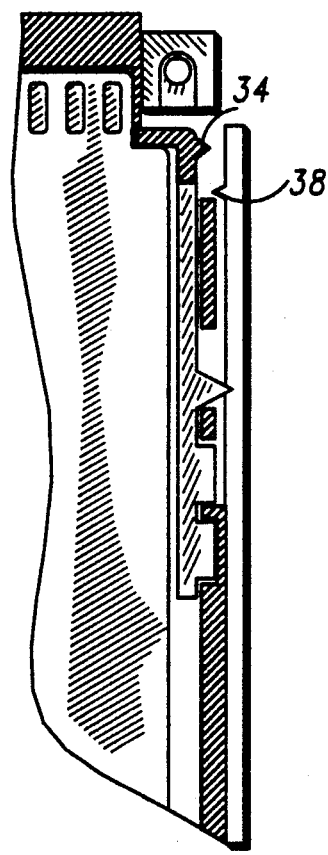
FIG. 5 depicts a cross-sectional top plan view of one side of a cartridge fully inserted into the DCD.

After insertion of the cartridge (11) into the cartridge carrier (FIG. 3) a first rib (33) on the door (32) strikes the engagement plate (37) on the cartridge carrier (FIG. 3), deflecting the first rib (33) and locking projection (40) away from the catch aperture (41). Shown in FIG. 4 is a cross-sectional view of the cartridge (11) and cartridge carrier showing engagement of the first rib (33) with the engagement plate (37).

Following engagement of the first rib (33) with the engagement plate (37) a second rib (34) on the door (32) engages an engagement rib (38) on the cartridge carrier. As the cartridge carrier (11) is inserted into the cartridge carrier the engagement rib (38) arrests the forward movement of the door (32) thereby automatically moving the door (32) to a second (retracted) position and exposing the connector (21). Upon reaching the fully retracted position the second rib (34) strikes a shoulder (35) on the cover of the cartridge (11) thereby resiliently deflecting the engagement rib (38) sufficiently for the second rib (34) to pass by the engagement rib (38).

As the engagement rib (38) releases the second rib (34) the electrical connector (21) on the memory board (20) engages an interface connector (39) on the cartridge carrier. Release of the second rib (34) from the engagement rib results in acceleration of the electrical connector (21) into the interface connector (39) thereby insuring seating of the electrical connector (21) into the interface connector (38).

To remove of the cartridge (11) from the DCD the user must grasp the cartridge and dislodge the electrical connector (21) from the interface connector (38). Upon dislocation of the electrical connector (21) from the interface connector (38) the second rib (34) again strikes the engagement rib (38). Upon engagement of the second rib (34) with the engagement rib (38) the sheath (32) is held stationary and automatically restored to the first position. Upon reaching the first position the locking projection (40) again engages the catch aperture (41) arresting further forward movement of the door (32) relative to the cartridge (11). The second rib (34) then deflects and passes by the engagement rib (38) releasing the cartridge from the DCD.

What is claimed is:

1. A digital communications device (DCD) including a removable cartridge that defines primary functions and operation of said DCD comprising:

A) said cartridge including:
  housing having a DCD interface side;
  printed circuit board (PCB) mounted to said housing;
  electrical connection means, disposed on one end of said PCB adjacent said DCD interface side, for interfacing said PCB to said DCD;
  memory means disposed on said PCB for storing instructions, said memory means coupled to said connection means;
  sheath means, attached to said housing and having a distal end, for moving relative to said housing and PCB, said sheath means having a first position in which said distal end projects beyond said housing and a second position in which said distal end is closer to said housing than in said first position;
  said PCB mounted to said housing such that said electrical connection means is exposed and projects beyond said distal end only when said sheath means is in said second position;

B) means mounted to said DCD for receiving said cartridge and engaging said sheath means, said receiving means including means for establishing electrical connection with said connection means;

C) said engaging means engaging said sheath means when said cartridge is inserted into said receiving means causing said sheath means to move from said first position to said second position thereby exposing said connection means on said PCB and allowing said establishing means to establish electrical connection with said memory means.

2. The device as in claim 1 wherein said engaging means causes said sheath means to move from said second position to said first position upon removal of said cartridge from said DCD.

3. The device as in claim 1 wherein said sheath means comprises means for releasibly locking said sheath means to said housing in said first position.

4. The device as in claim 3 wherein said engaging means comprises means for contacting said locking means when said cartridge is inserted into said receiving means, said means for contacting releasing said locking means thereby allowing said sheath means to move from said first to said second position.

5. The device as in claim 4 wherein said engaging means further comprises means for moving said sheath means from said second position to said first position upon removal of said cartridge from said DCD.

6. The device as in claim 1, define PCB and electrical connection means as extending beyond housing and sheath means enclosing and preventing access to same in first position.

7. The device as in claim 6, define PCB as stationary relative to housing.

8. The device as in claim 7, sheath means moving relative to PCB in going from the first to the second position leaving PCB and electrical connection exposed in the second position.

9. The device as in claim 1 wherein the DCD is a modem.

10. A removable cartridge that defines primary functions and operations of a digital communications device (DCD), comprising:

housing having a DCD interface side;
printed circuit board (PCB) mounted to said housing;
electrical connection means disposed on one end of said PCB for interfacing said PCB to said DCD;
memory means disposed on said PCB for storing instructions, said memory means coupled to said connection means;
sheath means, attached to said housing and having a distal end, for moving relative to said PCB, said sheath means having a first position in which access to said PCB and electrical connection means is prevented and a second position in which access to said PCB and electrical connection means is permitted;
means for releasibly locking said sheath means in said first position thereby protecting said electrical connection means and memory means in said first position.

11. The device as in claim 10 wherein the means for releasibly locking comprises a lever with a locking projection, disposed on each of two sides of the sheathing means, extending into the housing, with the projection engaging and extending through catch apertures in opposite side walls of the housing.

12. The device as in claim 10 wherein the electrical connection means is exposed and projects beyond said distal end only when said sheath means is in said second position.

13. A method for safeguarding instructions contained in a removable cartridge which defines functions of a digital communications device (DCD), said method comprising the steps of:

storing said instructions in electronic memory on a printed circuit board (PCB) mounted to a housing of said cartridge, said PCB having electrical access connectors adjacent an end of said PCB for establishing connections with said memory, said connectors fixedly mounted relative to said housing and extending beyond the housing;
preventing access to said PCB and connectors when said cartridge is not inserted into a receiving port in said DCD by a movable sheath which encloses said PCB and connectors;
moving said sheath automatically upon insertion of said cartridge into the receiving port thereby exposing said connectors which project beyond the housing;
establishing electrical connection between said DCD and memory by engagement of said connectors by an interface connector mounted to said receiving port of the DCD;
automatically restoring said sheath to its position preventing access to said PCB and connectors upon removal of said cartridge from said receiving port thereby protecting said memory from damage due to unwanted access when not in use.

* * * * *